(12) United States Patent
Ito et al.

(10) Patent No.: US 9,445,519 B2
(45) Date of Patent: Sep. 13, 2016

(54) METHOD OF MANUFACTURING THICK-FILM ELECTRODE

(71) Applicant: E I DU PONT DE NEMOURS AND COMPANY, Wilmington, DE (US)

(72) Inventors: Kazushige Ito, Kanagawa (JP); Kazutaka Ozawa, Kanagawa (JP)

(73) Assignee: E I DU PONT DE NEMOURS AND COMPANY, Wilmington, DE (US)

( * ) Notice: Subject to any disclaimer, the term of this patent is extended or adjusted under 35 U.S.C. 154(b) by 728 days.

(21) Appl. No.: 13/741,648

(22) Filed: Jan. 15, 2013

(65) Prior Publication Data

US 2014/0196781 A1     Jul. 17, 2014

(51) Int. Cl.
    *H05K 7/00*         (2006.01)
    *H01L 31/0224*    (2006.01)
    *H01B 1/22*        (2006.01)

(52) U.S. Cl.
    CPC *H05K 7/00* (2013.01); *H01B 1/22* (2013.01); *H01L 31/022425* (2013.01); *Y02E 10/50* (2013.01)

(58) Field of Classification Search
    CPC .................. H01L 31/022425; H05K 7/00
    See application file for complete search history.

(56) References Cited

U.S. PATENT DOCUMENTS

2008/0178930 A1    7/2008   Konno
2011/0095240 A1*   4/2011   Nakamura .............. C03C 3/062
                                                             252/514

* cited by examiner

*Primary Examiner* — Shannon Gardner

(57) ABSTRACT

A method of manufacturing a thick-film electrode comprising steps of: (a) applying a conductive paste onto a substrate comprising, (i) 100 parts by weight of a conductive powder, wherein the conductive powder is 16 to 49 weight percent based on the weight of the conductive paste; (ii) 0.5 to 10 parts by weight of a metal additive comprising bismuth (Bi); (iii) 1 to 25 parts by weight of a glass frit; and (iv) 50 to 300 parts by weight of an organic medium; and (b) firing the applied conductive paste to form the thick-film electrode, wherein thickness of the thick-film electrode is 0.5 to 15 μm.

10 Claims, 2 Drawing Sheets

METHOD OF MANUFACTURING THICK-FILM ELECTRODE

FIELD OF THE INVENTION

The invention relates to a method of manufacturing a thick-film electrode and a conductive paste to make a thick-film electrode.

TECHNICAL BACKGROUND OF THE INVENTION

A thick-film electrode which conventionally has tens of microns thickness needs to be thinner as electrical devices get down-sized or as material consumption needs to reduce. However, a thick-film electrode with insufficient thickness can have poor solder adhesion.

US20080178930 discloses a conductive paste to form a tab electrode of 20 to 30 μm thick on the back side of a solar cell. The conductive paste contains 40 to 93 weight percent (wt %) of Ag powder with particle diameter of 3.0 to 15.0 μm; and 2 to 10 wt % of glass particles; dispersed in 5 to 50 wt % of an organic vehicle.

SUMMARY OF THE INVENTION

An objective is to provide a method of manufacturing a thin thick-film electrode which has sufficient solder adhesion.

An aspect relates to a method of manufacturing a thick-film electrode comprising steps of: (a) applying a conductive paste onto a substrate comprising, (i) 100 parts by weight of a conductive powder, wherein the conductive powder is 16 to 49 weight percent based on the weight of the conductive paste; (ii) 0.5 to 10 parts by weight of a metal additive comprising bismuth (Bi); (iii) 1 to 25 parts by weight of a glass frit; and (iv) 50 to 300 parts by weight of an organic medium; and (b) thing the applied conductive paste to form the thick-film electrode, wherein thickness of the thick-film electrode is 0.5 to 15 μm.

Another aspect relates to a conductive paste to form a thick-film electrode with thickness of 0.5 to 15 μm comprising: (i) 100 parts by weight of a conductive powder, wherein the conductive powder is 16 to 49 weight percent based on the weight of the conductive paste, (ii) 0.5 to 10 parts by weight of a metal additive comprising bismuth (Bi), (iii) 1 to 25 parts by weight of a glass frit, and (iv) 50 to 300 parts by weight of an organic medium.

Another aspect relates to an electrical device containing the thick-film electrode manufactured by the method above.

The solder adhesion of the thick-film electrode which is thin can be improved by the present invention.

DETAILED DESCRIPTION OF THE INVENTION

Figure 1A:
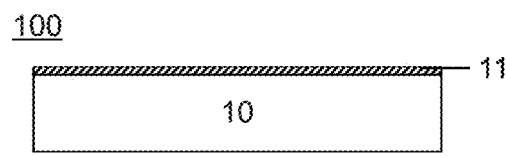
FIG. 1A to 1D explain a process of manufacturing a solar cell electrode.

The thick-film electrode is formed with a conductive paste. The method of manufacturing the thick-film electrode and the conductive paste to form thick-film electrode is explained respectively below.

Method of Manufacturing Thick-Film Electrode

The thick-film electrode is formed by applying a conductive paste onto a substrate, optionally drying the applied conductive paste, and firing the applied conductive paste.

For applying the conductive paste onto the substrate, screen printing, stencil printing, gravure printing, offset printing, spin coating, blade coating, casting, and nozzle discharge can be used. The screen printing is selected because the paste can be quickly screen printed in a desired pattern on a substrate in an embodiment.

To form the thick-film electrode having thickness of 0.5 to 15 μm, the amount of the conductive paste per unit area to be applied on the substrate which is called "lay down" can be 0.005 to 0.4 g/inch$^2$ in an embodiment, 0.01 to 0.25 g/inch$^2$ in another embodiment, 0.015 to 0.1 g/inch$^2$ in another embodiment.

Any types of substrate can be available. For example, the substrate can be made of glass, ceramic, metal, or semiconductor in an embodiment. Metal substrate, ceramic substrate, glass substrate or semiconductor substrate can be used as the substrate. In the event of metal or semiconductor substrate, an insulating layer can be formed on the substrate and the conductive paste is applied onto the insulating layer.

The conductive paste applied on the substrate can be optionally dried. The drying condition can be 70 to 380° C. for 0.1 to 20 minutes in an embodiment. By being dried, the solvent in the conductive paste evaporates so that the applied paste can fix to some extent on the substrate. However, the applied conductive paste can be also directly fired without having the drying step.

The thick-film electrode is formed by firing the applied conductive paste. The firing condition can vary depends on substrate type or properties of the conductive paste. The firing peak temperature can be 400 to 1000° C. in an embodiment, 520 to 980° C. in another embodiment, or 600 to 900° C. in another embodiment. The firing time can be 10 seconds to 1 hour in an embodiment, 30 seconds to 40 minutes in another embodiment.

The thick-film electrode is 0.5 to 15 μm thick in average. In another embodiment, the thickness of the electrode is at least 0.7 μm. The thickness of the electrode is 8.5 μm or less in another embodiment, 6.5 μm or less in another embodiment, and 3 μm or less in still another embodiment. The thick-film electrode with such thickness can be thin enough to be used in a small electrical device or can contribute to reduction of the materials use. The thickness of the electrode can be measured by a film thickness meter. SURFCOM 480A from Accretech company can be available to measure the thickness of the thick-film electrode.

The thick-film electrode is soldered to electrically interconnect with another electronic part. A solder ribbon, for example a copper coated with solder of Sn/Pb/Ag, Sn/Pb or Pb-free Sn/Bi can be used in soldering. Solder condition can be typically at 200 to 350° C. for 5 seconds with a flux that is mildly activated or not activated.

The thick-film electrode has sufficient solder adhesion so that the electrode can be hardly taken off from the substrate. The solder adhesion of the thick-film electrode can be 1.5 to 5 N in an embodiment, 1.5 to 3 N in another embodiment. The solder adhesion can be measured with a meter, for example Peel Force 606 from MOGRL Technology Co., Ltd.

The thick-film electrode can be used in any electrical device, for example resistor, capacitor, display panel, touch panel, or semiconductor device such as LED device and solar cell.

Figure 4:
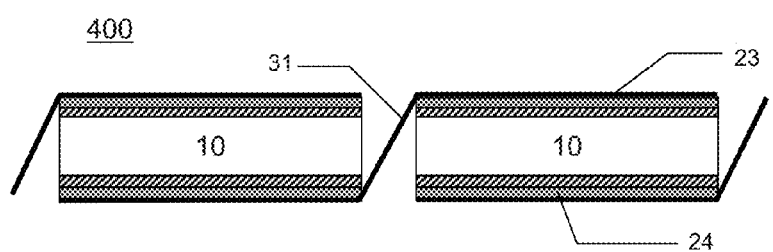
FIG. 4 is a cross-sectional diagram of a solar cell module.

One of the electrical device examples can be a solar cell. Solar cell has a thick-film electrode to electrically interconnect solar cells by soldering a metal wire such as a solder ribbon. The thick-film electrode is called "bus electrode" when it's formed on the front side and "tab electrode" when its formed on the back side of a solar cell. In an embodiment, the thick-film electrode is the bus electrode 23 and/or the tab electrode. 24 of a solar cell where the bus electrode 23 and the tab electrode 24 are connected by soldering the metal wire 31, consequently to form a solar cell module 400 as illustrated in FIG. 4.

In the specification, "front side" is the light-receiving side when the solar cell is actually installed to generate electricity, and "back side" is the opposite side of the front side.

An example of manufacturing a solar cell is explained referring to FIG. 1A to 1D. However, the present invention is not limited to this example.

A semiconductor substrate 100 comprise a semiconductor layer 10, for example a silicon wafer (FIG. 1A). A semiconductor substrate 100 can further comprise an insulating layer 11 on the front side surface of the semiconductor layer 10. The insulating layer 11 functions as a passivation layer, moreover as an anti-reflection coating (ARC). The insulating layer 11 can be formed on the back side surface of the semiconductor layer 10 as well although it is not illustrated in FIG. 1.

Silicon nitride ($SiN_x$) titanium oxide ($TiO_2$), aluminum oxide ($Al_2O_3$), silicon oxide ($SiO_2$), or indium tin oxide (ITO) can be used as a material of the insulating layer 11. The insulating layer 11 can be formed by sputtering, plasma-enhanced chemical vapor deposition (PECVD), or a thermal CVD or plasma CVD. A multiple layers configuration can be also available, for example two layers of silicon nitride/ silicon oxide or silicon nitride/aluminum oxide. The thickness of the insulating layers 11 can be 10 to 500 nm.

Figure 1B:
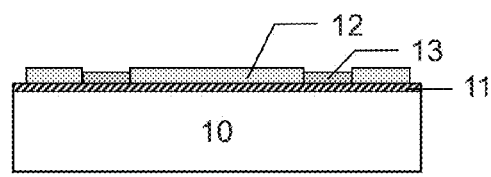

On the front side, a first conductive paste 12 to form finger lines and a second conductive paste 13 to form a bus electrode can be separately applied onto the front side of the semiconductor substrate 100 (FIG. 1B). There is no restriction on the order of applying the first conductive paste 12 and the second conductive paste 13. The first conductive paste 12 can be applied first in line pattern and then the second conductive paste 13 can be applied over the lines of the first conductive paste 12 in an embodiment.

When the insulating layer 11 is formed on the front side, the first conductive paste 12 can be capable of firing through the insulating layer 11 during firing to electrically contact with the semiconductor layer 10. The second conductive paste 13 is not necessary to be always capable of firing through the first insulating layer 11 because the main role of the bus electrode is to convert the electricity generated in the semiconductor substrate and taken out by the finger lines.

The second conductive paste 13 can be equivalent to the first conductive paste 12 so that the finger lines and the bus bar can be formed simultaneously in an embodiment.

Figure 1C:
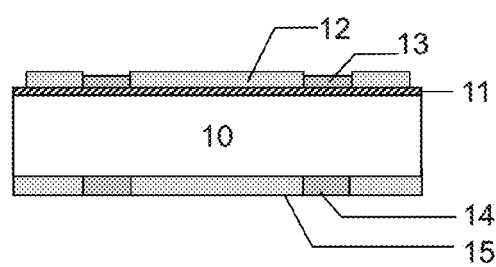

On the back side, a third conductive paste 14 to form a tab electrode and an aluminum (Al) paste 15 to form an Al electrode can be applied onto the back side of the semiconductor substrate 100 as illustrated in FIG. 1C. There is also no restriction on the order of applying the third conductive paste 14 and the Al paste 15. In an embodiment, the third conductive paste 14 can be applied on the semiconductor substrate first and then the Al conductive paste 15 can be applied at the rest of the area of the back side surface.

The third conductive paste 14 and the Al paste 15 can be applied directly onto the back side of the semiconductor layer 10 in an embodiment. In the event that the substrate 100 comprises the insulating layer on the back side too, the third conductive paste 14 and the Al paste 15 can be applied onto the insulating layer on the back side of the semiconductor layer 10 in another embodiment.

The applied pastes 12, 13, 14 and 15 can be optionally dried. In an embodiment, the drying condition can be 70 to 380° C. for 0.1 to 20 minutes to dry up the solvent contained in the paste. However, the applied conductive paste can be directly fired without being dried.

Figure 1D:
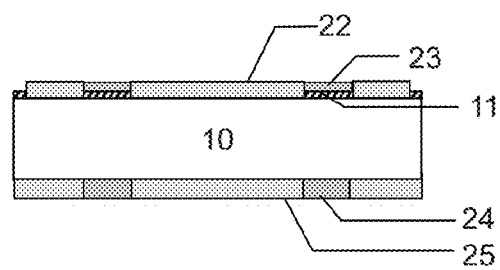

A finger line electrode 22, a bus electrode 23, a tab electrode 24 and an Al electrode 25 are obtained by firing the first conductive paste 12, the second conductive paste 13, the third conductive paste 14 and the Al paste 15 respectively as illustrated in FIG. 1D.

The first conductive paste 12 can fire through the insulating layer 11 during firing so that the finger lines 22 can electrically contact with the semiconductor layer 10. The second conductive paste 13 does not fire through the insulating layer 11 in an embodiment as shown in FIG. 1D.

The firing can be carried out with setting peak temperature at 400 to 1000° C. for 1 second to 15 minutes. In another embodiment, the setting peak temperature can be from 400 to 600° C. for 5 seconds to 23 minutes, and over 600° C. for 3 seconds to 19 minutes. Total firing time can be 10 seconds to 30 minutes in an embodiment, 20 seconds to 15 minutes in another embodiment, 30 seconds to 5 minutes in another embodiment. When firing with such conditions, the electrodes can be formed with less damage to the semiconductor layer. A furnace that is controllable on temperature and time can be used. The firing time can be counted, for example, from entrance to exit of the furnace.

The finger line electrode 22 can be 15 to 40 µm thick. The thickness of the bus bar electrode 23 can be 0.5 to 40 µm in an embodiment. The thickness of the tab electrode 24 is 0.5 to 15 µm in an embodiment. The Al electrode 25 can be 20 to 30 µm thick in an embodiment.

In the explanation above, the pastes on the front side and the back side are fired at the same time, which is called co-firing. With co-firing, the process can be shorter and simpler to reduce production cost. Alternatively, the pastes on the front side which are the first conductive paste 12 and the second conductive pate 13 and the pastes on the back side which are the third conductive paste 14 and the Al paste 15, can be fired separately. For example applying and firing the pastes 14 and 15 on the back side first and then applying and firing the pastes 12 and 13 on the front side. Firing the front side and the back side separately is effective especially when a suitable firing condition is different for each paste.

In an embodiment, the bus electrode 23 and the tab electrode 24 can be formed by the present invention. The bus electrode 23 and the tab electrode 24 are thin such as 1 to 15 µm thick and have sufficient conductivity enough to transfer electrons from a cell to another cell. The bus electrode 23 can be formed together with the finger line electrode 22 by using the same first conductive paste. In another embodiment, only the tab electrode 24 is formed by the present invention.

Figure 2:
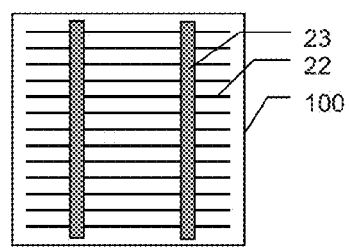
FIG. 2 is a schematic diagram of the front side of a solar cell.

An example of the pattern of the finger line electrode 22 and the bus electrode 23 can contain two lines of the bus electrode 23 and finger fines 22 formed at the both sides of the bus electrode 23 as illustrated in FIG. 2. The bus electrode 23 can be just one line or three lines instead of the two lines in another embodiment.

Figure 3:
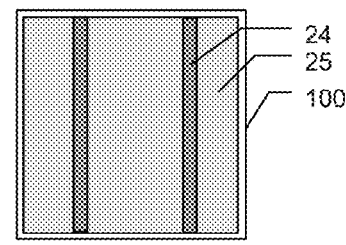
FIG. 3 is a schematic diagram of the back side of a solar cell.

The pattern of the tab electrode 24 and the Al electrode 25 on the back side can be of two lines of the tab electrodes 24 and the Al electrodes 25 to cover the rest of the back side surface of the substrate 100 as illustrated in FIG. 3. The tab electrode 24 can be just one line or three lines instead of the two lines in another embodiment. The tab electrodes 24 and the Al electrodes 25 can be partially over lapped at the border of these electrodes.

Next, the conductive paste for manufacturing the thick-film electrode is explained in detail below.

Conductive Paste

The conductive paste contains inorganic powder dispersed into an organic medium.

The viscosity of the conductive paste can be 10 to 200 Pascal second (Pa·s) in an embodiment, 20 to 90 Pa·s in another embodiment. The viscosity can be measured with a viscometer Brookfield HBT using a spindle #14 at 10 rpm at room temperature.

The conductive paste contains (i) 100 parts by weight of a conductive powder, (H) 0.5 to 10 parts by weight of a metal additive comprising bismuth (Bi), (iii) 1 to 25 parts by weight of a glass frit, and (iv) 50 to 300 parts by weight of an organic medium.

(i) Conductive Powder

The conductive powder contains electrically conductive metal whose electrical conductivity 0.80×10 Siemens (S)/m or more at 293 Kelvin.

The electrically conductive metal can be, for example, gold (Au; $4.55 \times 10^7$ S/m), platinum (Pt, $0.94 \times 10^7$ S/m), ruthenium (Ru; $1.30 \times 10^7$ S/m), palladium (Pd; $0.92 \times 10^7$ S/m), aluminum (Al; $3.64 \times 10^7$ S/m), nickel (Ni; $1.45 \times 10^7$ S/m), copper (Cu; $5.81 \times 10^7$ S/m), silver (Ag; $6.17 \times 10^7$ S/m), gold (Au; $4.17 \times 10^7$ S/m), molybdenum (Mo; $2.10 \times 10^7$ S/m), tungsten (W; $1.82 \times 10^7$ S/m), cobalt (Co; $1.46 \times 10^7$ S/m), zinc (Zn; $1.64 \times 10^7$ S/m) and a mixture of these.

In another embodiment, conductive powder is metal powder having an electrical conductivity $3.00 \times 10^7$ S/m or more at 293 Kelvin. Conductive powder may be one or more metal powder selected from the group consisting of Al, Cu, Ag and Au. Using such conductive metal powder having relatively high electrical conductivity, electrical property of a solar cell could be further improved.

The conductive powder can be Ag containing powder, for example Ag powder, Ag—Ni alloy powder, Ag—Cu alloy powder, Ag—Pd alloy powder, Ag—Al alloy powder in another embodiment. Especially for the tab electrode, silver which is solderable can be used.

Purity of the electrically conductive metal in the conductive powder can be at least 95 wt % in an embodiment, at least 97 wt % in another embodiment, and at least 99 wt % in another embodiment based on the weight of the conductive powder.

In an embodiment, the conductive powder can be spherical.

The particle diameter of the conductive powder can be 0.05 μm or larger in an embodiment, 0.1 μm or larger in another embodiment, and 0.5 μm or larger in still another embodiment. The particle diameter of the conductive powder can be 5 μm or smaller in an embodiment, 3 μm or smaller in another embodiment, and 1 μm or smaller in still another embodiment. The conductive powder with such particle diameter can be suitable to form such thin thick-film electrode.

The particle diameter is obtained by measuring the distribution of the particle diameters by using a laser diffraction scattering method. The median which is 50th percentile of the particle size distribution as measured by volume is defined as D50 to represent the particle diameter. Microtrac model X-100 is an example of the commercially-available devices that can be used for this measurement.

The conductive powder can be 16 to 49 wt %; 20 to 40 wt % in another embodiment, 24 to 36 wt % in another embodiment based on the weight of the conductive paste. With such relatively small amount of the conductive powder in the conductive paste, the electrode can be sufficiently thin by burning out or carbonizing the organic medium during firing. The metal consumption can be reduced at the same time.

(ii) Metal Additive

The conductive paste contains 0.5 to 10 parts by weight of a metal additive containing bismuth (Bi). The metal additive consists of metallic element. However the metal additive could have natural oxidation; for example on surface of the metal additive particles.

The metal additive containing Bi could increase solder adhesion of the thick-film electrode, even if the electrode is as thin as 0.5 to 15 μm as shown in Example below. The Bi containing metal additive can be Bi element powder, Bi base alloy powder or a mixture thereof in an embodiment. The Bi base alloy powder can comprise, for example Bi—Sn alloy, Bi—Pb alloy, Bi—In alloy or a mixture thereof.

The metal additive contains Bi at least 60 wt % in an embodiment, 78 wt % in another embodiment, 95 wt % in another embodiment based on the weight of the metal additive.

The metal additive can be in any shape, spherical, flaky or nodular in an embodiment. The particle diameter (D50) of the metal additive powder can be 0.5 to 10 μm in an embodiment, 1 to 5 μm in another embodiment, and 1.2 to 2.5 μm in still another embodiment. The metal additive powder with such particle diameter can disperse well in the organic medium. The particle diameter can be measured as well as the conductive powder described above.

The metal additive can be, against 100 parts by weight of the conductive powder, 1 to 9 parts by weight in another embodiment, 2 to 6 parts by weight in another embodiment based on the weight of the conductive paste. With such amount of the conductive powder, solder adhesion can increase as shown in Example below.

(iii) Glass Frit

The conductive paste contains 1 to 25 parts by weight of the glass frit. The glass frit melts during firing to increase the adhesion of the thick-film electrode to the substrate.

The conductive paste contains, against 100 parts by weight of the conductive powder, 5 to 20 parts by weight in another embodiment, 12 to 18 parts by weight in another embodiment in view of sufficient adhesion between the thick-film electrode and the substrate.

The chemical composition of the glass frit here is not limited. Any glass frit can be used in the conductive paste. For example a lead-boron-silicon glass or a lead-free bismuth glass frit can be available.

In an embodiment, the softening point of the glass frit can be 390 to 600° C. When the softening point is in the range, the glass frit could melt properly to sufficiently adhere to the substrate.

(iv) Organic Medium

The conductive paste contains 50 to 300 parts by weight of an organic medium. The inorganic powders are dispersed into the organic medium to form a viscous composition called "paste", having suitable viscosity for applying on a substrate in a desired pattern. The organic medium can be mostly removed during the firing by being burned out or carbonized.

The conductive paste contains, against 100 parts by weight of the conductive powder, 88 to 280 parts by weight in another embodiment, 180 to 250 parts by weight in another embodiment. With such amount of the organic medium, the conductive paste having suitable viscosity for applying on the substrate can be made.

There is no restriction on the composition of the organic medium. The organic medium can comprise at least an organic polymer and optionally a solvent in an embodiment.

A wide variety of inert viscous materials can be used as the organic polymer. The organic polymer can be epoxy resin, melamine resin, urea resin, unsaturated polyester resin, alkyd resin, polyurethane resin, an organic-inorganic hybrid resin, phenol resin, polyethylene, polypropylene, polyethylene terephthalate, polyamide, polyimide-imide, acrylic resin, phenoxy resin, ethyl-cellulose or a mixture thereof.

The solvent can be optionally added to the organic medium to adjust the viscosity of the conductive paste if necessary. In an embodiment, the solvent can comprise texanol, ester alcohol, terpineol, kerosene, dibutylphthalate, butyl carbitol, butyl carbitol acetate, hexylene glycol or a mixture thereof.

In the event of adding solvent to the organic polymer, mixing ratio of organic-polymer:solvent can be 1:15 to 1:5 in an embodiment.

Other Additive

In addition to the materials above, an organic additive such as a thickener, a stabilizer, an emulsifier, and a viscosity modifier, or an inorganic additive such as a metal oxide, for example a powder of titan oxide ($TiO_2$), copper oxide (CuO), and zinc oxide (ZnO) can be added to the conductive paste. Multiple types of additives can be used. Type and amount of the additives can be chosen by people in the industry, in view of desired characteristics such as preservation stability, printability, or resulting electrical property.

EXAMPLES

The present invention is illustrated by, but is not limited to, the following example.

Conductive Paste Preparation

The conductive paste was prepared with the following procedure. The organic polymer and the organic solvent were mixed in a glass vial for 48 hours at 100° C. to form an organic medium. The Ag powder and the Bi element powder or $Bi_2O_3$ powder were added to the organic medium to mix further for 5 minutes by a planetary centrifugal mixer to form a conductive paste. The viscosity of the conductive paste was 30 Pa·s as measured with a viscometer Brookfield HBT using a spindle #14 at 10 rpm at room temperature.

The materials used to form the conductive paste and amounts of each material are shown below, and in Table 1-1 and 1-2.

Conductive powder: spherical Ag powder with particle diameter (D50) of 0.8 μm.
Metal additive: spherical Bi element powder with particle diameter (D50) of 1.5 μm (BIE11PB, Kojundo chemical laboratory) or spherical $B_2O_3$ powder with particle diameter (D50) of 0.4 μm.
Glass frit a lead-free bismuth glass frit.
Organic medium: a mixture of 8 wt % of ethylcellulose and 92 wt % of a mixture of terpineol and texanol based on the weight of the organic medium.
Other additive: stabilizer

TABLE 1-1

| | (parts by weight) Paste Number | | | | |
|---|---|---|---|---|---|
| Composition | 1 | 2 | 3 | 4 | 5 |
| Ag powder | 100 | 100 | 100 | 100 | 100 |
| (wt %*) | (30.0) | (29.9) | (29.7) | (29.3) | (28.6) |
| Bi element powder | 0 | 1.7 | 3.3 | 8.3 | 16.7 |
| Glass frit | 8.3 | 8.3 | 8.3 | 8.3 | 8.3 |
| Organic medium | 225 | 225 | 225 | 225 | 225 |
| Other additive | 0.5 | 0.5 | 0.5 | 0.5 | 0.5 |

*Weight percent based on the weight of the conductive paste.

TABLE 1-2

| | (parts by weight) Paste Number | | | |
|---|---|---|---|---|
| Composition | 6 | 7 | 8 | 9 |
| Ag powder | 100 | 100 | 100 | 100 |
| (wt %*) | (29.9) | (29.7) | (29.3) | (28.6) |
| $Bi_2O_3$ powder | 1.7 | 3.3 | 8.3 | 16.7 |
| Glass Frit | 8.3 | 8.3 | 8.3 | 8.3 |
| Organic medium | 225 | 225 | 225 | 225 |
| Other additive | 0.5 | 0.5 | 0.5 | 0.5 |

*Weight percent based on the weight of the conductive paste.

Forming a Solar Cell Electrode

The conductive paste was applied by screen printing onto a Si wafer as a semiconductor substrate (38 mm×38 mm). The applying pattern of the conductive paste was line shape of 3 mm wide and 38 mm long. Amount of the applied conductive paste so-called "lay down" was 0.027 g/inch².

The applied conductive paste on the substrate was dried at 150° C. for 5 minutes and then fired at the set peak temperature of 780° C. for 5 minutes in a furnace (Despatch IR belt furnace) to form an electrode.

The formed thick-film electrode had thickness of 1 μm in average according to the measurement by using Surfcom 480A from Accretech company. The thick-film electrode was scratched with a tip of tweezers to make six lines to get the Si wafer surface appear. The level difference between the Si wafer surface and the upper surface of the electrode at each of the six lines was measured by Surfcom 480A.

Measurement of Solder Adhesion

The solder adhesion of the electrode was measured by the following procedures. The substrate with the electrode was put on a 90° C. hot plate. A copper ribbon coated with a Sn/Pb solder (Cu—O-155-2-B, Marusho. Co., Ltd.) was dipped into a soldering flux (Kester-952S, Kester, Inc.) and then dried for five seconds in air. Half of the solder coated copper ribbon was placed on the electrode and soldering was done by a soldering system (Hakko-926, Hakko Corporation).

The soldering iron setting temperature was 400° C. and the actual temperature of the soldering iron at the tip was from 230 to 240° C. measured by K-type thermocouple. The glass substrate with the soldered electrode was taken off the hotplate, and cooled down to the room temperature.

The rest part of the copper ribbon which did not adhere to the electrode was horizontally folded and pulled at 120 mm/min by a machine (Peel Force 606, MOGRL Technology Co., Ltd.). The strength (Newton, N) at which the copper ribbon was detached was recorded as adhesion of the electrode.

Results

Figure 5:
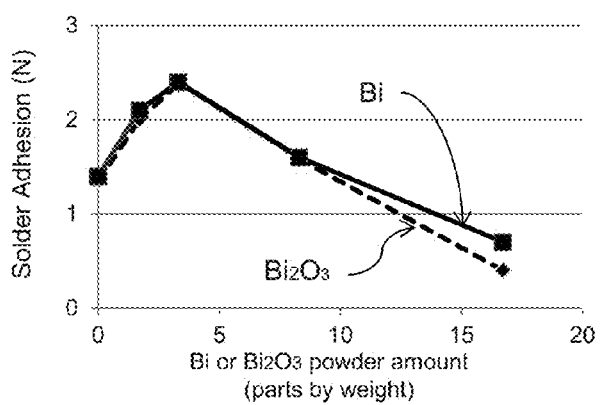
FIG. 5 shows relation between solder adhesion and amount of Bi element powder and $B_2O_3$ powder respectively in Example.

Solder adhesion of the formed electrode with the paste #1 to 9 respectively was shown in FIG. 5. When adding 1.7, 3.3, and 8.3 parts by weight of the Si element powder or $B_2O_3$ powder to the conductive paste (paste #2 to #4 and #6 to #8), the solder adhesion of the formed electrode increased, compared to the electrode formed with the paste containing neither Bi element powder nor $Bi_2O_3$ powder (paste #1). The solder adhesion decreased even lower than 1 N when adding 16.7 parts by weight of Bi element powder or $Bi_2O_3$ powder (paste #5 and #9).

The solder adhesion was further examined. Electrodes were formed in the same manner except for the paste compositions. The paste compositions are shown in Table 2 where the glass frit was nearly doubled of that in Table 1. Paste #10 contained Si element powder and paste #11 contained $Bi_2O_3$ powder.

Figure 6:
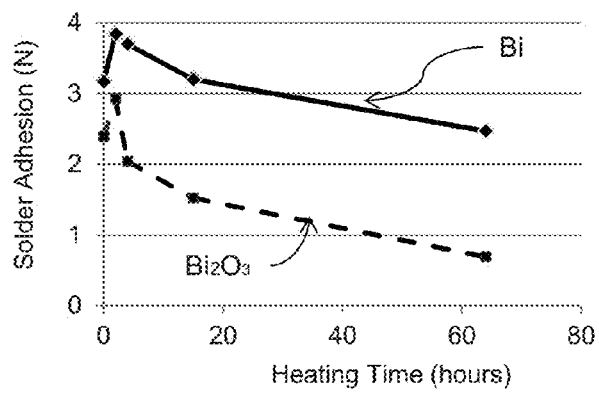
FIG. 6 shows relation between solder adhesion and heating time at 150° C. about the thick-film electrode containing Bi and $Bi_2O_3$ respectively in Example.

The formed thick-film electrode was kept in a thermostatic oven set up at 150° C. for 0, 2, 4, 15, 64 hours to see long-term heat resistance, because the thick-film electrode could be detached by heat during practical use. Then the solder adhesion was measured on the aged electrode at 150° C. with the same method as above using Peel Force 606, MOGRL Technology Co., Ltd. The results are shown in FIG. 6.

The thick-film electrode formed with paste #10 that contained Bi element powder could keep sufficient solder adhesion through the heating time of 64 hours. However the electrode formed with paste #11 that contains $Bi_2O_3$ powder lost considerably solder adhesion after the heating time of 64 hours.

TABLE 2

| Composition | (parts by weight) Paste Number | |
|---|---|---|
| | 10 | 11 |
| Ag powder (wt %*) | 100 (30.0) | 100 (30.0) |
| Bi element powder | 3.3 | 0 |
| $Bi_2O_3$ powder | 0 | 3.3 |
| Glass Frit | 15.6 | 15.6 |
| Organic medium | 216 | 216 |
| Additive | 0.86 | 0.86 |

*Weight percent based on the weight of the conductive paste.

We claim:

1. A method of manufacturing a thick-film electrode comprising steps of:
   (a) applying a conductive paste onto a substrate, the conductive paste comprising,
      (i) 100 parts by weight of a conductive powder, wherein the conductive powder is 16 to 49 weight percent based on the weight of the conductive paste;
      (ii) 0.5 to 10 parts by weight of a metal additive comprising bismuth (Bi), wherein the metal additive is Bi element powder, Bi base alloy powder or a mixture thereof;
      (iii) 1 to 25 parts by weight of a glass frit; and
      (iv) 50 to 300 parts by weight of an organic medium; and
   (b) firing the applied conductive paste to form the thick-film electrode, wherein thickness of the thick-film electrode is 0.5 to 15 µm.

2. The method of claim 1, wherein the metal additive comprises Bi at least 60 wt % based on the weight of the metal additive.

3. The method of claim 1, wherein viscosity of the conductive paste is 10 to 200 Pascal second.

4. The method of claim 1, wherein particle diameter (D50) of the metal additive is 0.5 to 10 µm.

5. The method of claim 1, wherein the firing peak temperature in the firing step is 400 to 1000° C.

6. The method of claim 1, wherein the substrate is made of glass, ceramic, metal or semiconductor.

7. The method of claim 1, wherein amount of the applied conductive paste per unit area on the substrate is 0.005 to 0.4 g/inch².

8. An electrical device containing the thick-film electrode manufactured by the method of claim 1.

9. The electrical device of claim 8 is a solar cell.

10. The electrical device of claim 9, wherein the thick-film electrode is a tab electrode formed on a back side of the solar cell.

* * * * *